(12) United States Patent
Zampini et al.

(10) Patent No.: US 10,261,418 B2
(45) Date of Patent: Apr. 16, 2019

(54) COATING COMPOSITIONS FOR USE WITH AN OVERCOATED PHOTORESIST

(71) Applicant: Rohm and Haas Electronic Materials LLC, Marlborough, MA (US)

(72) Inventors: Anthony Zampini, Marlborough, MA (US); Gerald B. Wayton, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/250,302

(22) Filed: Aug. 29, 2016

(65) Prior Publication Data

US 2016/0363862 A1    Dec. 15, 2016

Related U.S. Application Data

(63) Continuation of application No. 11/712,160, filed on Feb. 28, 2007, now Pat. No. 9,429,844.
(Continued)

(51) Int. Cl.
| | | |
|---|---|---|
| *G03F 7/09* | (2006.01) | |
| *G03F 7/20* | (2006.01) | |
| *C08L 33/06* | (2006.01) | |
| *C08L 35/00* | (2006.01) | |
| *C08L 67/00* | (2006.01) | |
| *C09D 133/06* | (2006.01) | |
| *C09D 133/12* | (2006.01) | |
| *C09D 135/00* | (2006.01) | |
| *C09D 145/00* | (2006.01) | |

(Continued)

(52) U.S. Cl.
CPC .............. *G03F 7/091* (2013.01); *C08L 35/00* (2013.01); *C09D 133/064* (2013.01); *C09D 133/066* (2013.01); *C09D 133/12* (2013.01); *C09D 135/00* (2013.01); *C09D 145/00* (2013.01); *C09D 167/02* (2013.01); *G03F 7/2004* (2013.01); *H01L 21/0276* (2013.01); *C08L 33/066* (2013.01); *C08L 67/00* (2013.01); *C08L 2312/00* (2013.01); *G03F 7/094* (2013.01); *G03F 7/2041* (2013.01)

(58) Field of Classification Search
CPC .......... C08L 33/08; C08L 33/00; C08L 75/04; C08L 23/0853; C08L 53/00; C08L 81/06; C08L 75/06; C08L 2666/02; C08L 2666/04; C08L 2666/06; C08L 2666/18; C08L 33/06; C08L 71/02; C08L 77/10; C08L 2201/52; C08L 2314/00; C08L 23/0815; C08L 31/04; C08L 33/04; C08L 33/12; C08L 35/00; C08L 3/02; C08L 47/00; C08L 51/06; C08L 67/00; C08L 93/04; C08L 95/00; C08L 9/06; H01L 2924/0665; H01L 2224/2919; H01L 2924/3512; H01L 21/6836; H01L 2221/68327; H01L 2224/274; H01L 2224/8385; H01L 24/27; H01L 24/83; H01L 2924/01005; H01L 2924/01006; H01L 2924/01013; H01L 2924/01015; H01L 2924/01016; H01L 2924/01019; H01L 2924/01027; H01L 2924/01029; H01L 2924/01033; H01L 2924/01047; H01L 2924/01051; H01L 2924/01061; H01L 2924/01074; H01L 2924/01079; B29C 47/065; B29C 61/02; B29C 65/4835; B29C 65/485; B29C 65/70; B29C 71/00; B82Y 30/00; C09K 8/467; C09K 2208/24; C09K 2208/26; C09K 2208/30; C09K 5/20; C09K 8/03; C09K 8/035; C09K 8/40; G03G 5/0596; G03G 5/0603; G03G 5/0609; G03G 5/0612; G03G 5/0618; G03G 5/062; G03G 5/075; G03G 5/14773; G03G 5/14786; G03G 9/0806; G03G 9/0821; G03G 9/08702; G03G 9/08791; G03G 9/08795; G03G 9/08; G03F 7/091; G03F 7/2004; G03F 7/094; G03F 7/2041

See application file for complete search history.

(56) References Cited

U.S. PATENT DOCUMENTS

| | | | |
|---|---|---|---|
| 4,256,805 A | 3/1981 | Tugukuni et al. | |
| 5,886,102 A | 3/1999 | Sinta et al. | |

(Continued)

FOREIGN PATENT DOCUMENTS

| | | |
|---|---|---|
| CA | 2014693 A1 | 10/1990 |
| CA | 2015044 A1 | 10/1990 |

(Continued)

OTHER PUBLICATIONS

English Language Summary of Office Action issued in counterpart Japanese Patent Application No. 2013-096761—dated Nov. 5, 2013 (5 Pages).

(Continued)

*Primary Examiner* — Cynthia Hamilton
(74) *Attorney, Agent, or Firm* — Mintz Levin Cohn Ferris Glovsky and Popeo, P.C.; Peter F. Corless

(57) ABSTRACT

Organic coating composition are provided including antireflective coating compositions that can reduce reflection of exposing radiation from a substrate back into an overcoated photoresist layer and/or function as a planarizing or via-fill layer. Preferred organic coating compositions of the invention comprise one or more resins that can harden upon thermal treatment without generation of a cleavage product. Particularly preferred organic coating compositions of the invention comprise one or more components that comprise anhydride and hydroxy moieties.

15 Claims, No Drawings

Related U.S. Application Data

(60) Provisional application No. 60/777,787, filed on Feb. 28, 2006.

(51) Int. Cl.
  *C09D 167/02* (2006.01)
  *H01L 21/027* (2006.01)

(56) References Cited

U.S. PATENT DOCUMENTS

| | | |
|---|---|---|
| 6,136,501 A | 10/2000 | Trefonas, III et al. |
| 6,165,697 A | 12/2000 | Thackeray et al. |
| 6,200,728 B1 | 3/2001 | Cameron et al. |
| 2003/0162125 A1 | 8/2003 | Deshpande |
| 2003/0220431 A1 | 11/2003 | Xu et al. |
| 2005/0112494 A1 | 5/2005 | Yao et al. |
| 2006/0004161 A1 | 1/2006 | Jung et al. |
| 2006/0014106 A1 | 1/2006 | Hatakeyama et al. |
| 2010/0136482 A1 | 6/2010 | Harada et al. |

FOREIGN PATENT DOCUMENTS

| | | |
|---|---|---|
| CA | 2018061 A1 | 12/1990 |
| EP | 0393446 B1 | 6/1994 |
| EP | 0542008 B1 | 8/1998 |
| EP | 0813114 B1 | 2/2004 |
| GB | 1583316 A | 1/1981 |
| JP | 2000313779 A | 11/2000 |
| JP | 2006053543 A | 2/2006 |
| JP | 2006504807 A | 2/2006 |
| WO | WO-98054619 A1 | 12/1998 |
| WO | WO-03067329 A1 | 8/2003 |

OTHER PUBLICATIONS

European Search Report of Corresponding European Patent Application No. EP 07 25 0796.

March, Jerry, Advanded Organic Chemistry: Reactions, Mechanisms, and Structure, Second Edition, McGraw-Hill Book Company, New York, N.Y. 1977, p. 362.

English Language Summary of Office Action issued in counterpart Korean Patent Application No. 10-2018-0074525 (3 Pages).

COATING COMPOSITIONS FOR USE WITH AN OVERCOATED PHOTORESIST

This application is a continuation application of U.S. application Ser. No. 11/712,160, filed Feb. 28, 2006 which claims the benefit of U.S. provisional application 60/777,788 filed Feb. 28, 2006.

The present invention relates to compositions (including antireflective coating compositions or "ARCs") that can reduce reflection of exposing radiation from a substrate back into an overcoated photoresist layer and/or function as a planarizing or via-fill layer. More particularly, the invention relates to organic coating compositions, particularly antireflective coating compositions, that comprise one or more resins that can harden upon thermal treatment, without use of a separate crosslinker component.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced or chemical transformation of the photoresist coating to thereby transfer the pattern of the photomask to the photoresist-coated substrate. Following exposure, the photoresist is developed to provide a relief image that permits selective processing of a substrate.

A major use of photoresists is in semiconductor manufacture where an object is to convert a highly polished semiconductor slice, such as silicon or gallium arsenide, into a complex matrix of electron conducting paths, preferably of micron or submicron geometry, that perform circuit functions. Proper photoresist processing is a key to attaining this object. While there is a strong interdependency among the various photoresist processing steps, exposure is believed to be one of the most important steps in attaining high resolution photoresist images. Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non intended, again resulting in linewidth variations. The amount of scattering and reflection will typically vary from region to region, resulting in further linewidth non-uniformity. Variations in substrate topography also can give rise to resolution-limiting problems.

One approach used to reduce the problem of reflected radiation has been the use of a radiation absorbing layer interposed between the substrate surface and the photoresist coating layer. See U.S. Patent Publication 2005/0112494 which reports antireflective compositions that contain a certain resin, a glycoluril crosslinking agent and an acid.

For many high performance lithographic applications, particular antireflective compositions are utilized in order to provide the desired performance properties, such as optimal absorption properties and coating characteristics. Nevertheless, electronic device manufacturers continually seek increased resolution of a photoresist image patterned over antireflective coating layers and in turn demand ever-increasing performance from an antireflective composition.

It thus would be desirable to have new antireflective compositions for use with an overcoated photoresist.

We have now discovered new organic coating composition including antireflective compositions ("ARCs") for use with an overcoated photoresist layer. Preferred organic coating compositions and systems of the invention can provide enhanced lithographic results (e.g., resolution) of an overcoated photoresist image.

More specifically, in one aspect, organic coating compositions, particularly antireflective compositions for use with an overcoated photoresist, are provided that comprise one or more resins that can harden upon thermal treatment without use of a separate crosslinker component, including without use of previously employed crosslinkers such as amine-based materials (e.g. melamine, glycouril or benzoquanamine) or epoxy materials.

In another aspect, organic coating compositions, particularly antireflective compositions for use with an overcoated photoresist, are provided that comprise one or more resins that comprise anhydride and hydroxy (e.g. alcohol) moieties.

Preferred compositions of this aspect of the invention can undergo hardening upon thermal treatment without the use of any separate crosslinker component, including without use of previously employed crosslinkers such as amine-based materials (e.g. melamine, glycouril or benzoquanamine) or epoxy materials. In such preferred compositions, anhydride and hydroxy moieties react to harden the composition.

In a yet further aspect of the invention, organic coating compositions, particularly antireflective compositions for use with an overcoated photoresist, are provided that comprise one or more components that can harden upon thermal treatment without the liberation of any volatile species, i.e. a group that is cleaved (covalent bond breakage) in a crosslinking reaction, particularly where the cleavage product has a molecular weight of 500, 400, 300, 200, or 100 or less.

In preferred embodiments, thermal treatment of a coating composition of the invention promotes an addition reaction of one or more composition components, e.g. an addition reaction between anhydride and alcohol groups that may be present on one or more composition components such as a resin component. Exemplary alcohol moieties include e.g. alcohol (e.g. $C_{1\text{-}12}$alcohol), carboxy, and aromatic alcohols such as phenolics and naphthols. Exemplary anhydride groups include e.g. maleic anhydride, itaconic anhydride, and succinic anhydride.

In a still further aspect, organic coating compositions, particularly antireflective compositions for use with an overcoated photoresist, that do not contain, or are at least essentially free of, an added acid or acid generator compound (e.g. thermal acid generator compound and/or photoacid generator compound).

Antireflective coating compositions of the invention preferably will comprise a component that contains one or more chromophore groups that can effectively absorb exposure radiation employed to image an overcoated photoresist layer. Typical chromophore groups are aromatic groups such as optionally substituted carbocyclic aryl groups including optionally substituted phenyl, anthracene and naphthyl. For antireflective coating compositions that are used with an overcoated photoresist composition imaged at 248 nm, preferred chromophore groups may include optionally substituted anthracene and optionally substituted naphthyl. For antireflective coating compositions that are used with an overcoated photoresist composition imaged at 193 nm, preferred chromophore groups may include optionally substituted phenyl.

Such chromophore groups may be incorporated into an antireflective coating composition of the invention through a variety of approaches. Preferred compositions may comprise a resin component which comprises one or more resins that comprise one or more chromophore groups such as optionally substituted carbocyclic aryl groups that may be pendant or integral to a resin backbone. Alternatively or in addition to such use of an absorbing resin, the antireflective composition may comprise a further component such as one or more non-polymeric dye compounds that comprise such chromophore groups, e.g. a small molecule (e.g. MW less than about 1000 or 500) that contains one or more chromophore moieties, such as one or more optionally substituted phenyl, optionally substituted anthracene or optionally substituted naphthyl groups.

Preferably, coating compositions of the invention can be cured through thermal treatment of the composition coating layer. Exemplary thermal cure conditions include treatment of a composition coating layer at 150° C. or more for 30 seconds or more.

For use as an antireflective coating composition, as well as other applications such as via-fill, preferably the composition is cured prior to applying a photoresist composition layer over the composition layer.

Coating compositions of the invention are typically formulated and applied to a substrate as an organic solvent solution, suitably by spin-coating (i.e. a spin-on composition).

A variety of photoresists may be used in combination (i.e. overcoated) with a coating composition of the invention. Preferred photoresists for use with the antireflective compositions of the invention are chemically-amplified resists, especially positive-acting photoresists that contain one or more photoacid generator compounds and a resin component that contains units that undergo a deblocking or cleavage reaction in the presence of photogenerated acid, such as photoacid-labile ester, acetal, ketal or ether units. Negative-acting photoresists also can be employed with coating compositions of the invention, such as resists that crosslink (i.e. cure or harden) upon exposure to activating radiation. Preferred photoresists for use with a coating composition of the invention may be imaged with relatively short-wavelength radiation, e.g. radiation having a wavelength of less than 300 nm or less than 260 nm such as about 248 nm, or radiation having a wavelength of less than about 200 nm, such as 193 nm.

The invention further provides methods for forming a photoresist relief image an electronic devices as well as novel articles of manufacture comprising substrates (such as a microelectronic wafer substrate) coated with a coating composition of the invention alone or in combination with a photoresist composition.

Other aspects of the invention are disclosed infra.

As discussed above, in one aspect, organic coating compositions, particularly antireflective compositions for use with an overcoated photoresist, are provided that comprise one or more components that can harden upon thermal treatment without the generation of any volatile species, i.e. a group that is cleaved (covalent bond breakage) in a crosslinking reaction, particularly where the cleavage product is relatively low molecular weight such as a molecular weight of about 500, 400, 300, 200 or 100 or less. In preferred embodiments, thermal treatment promotes an addition reaction of one or more composition components, e.g. an addition reaction between anhydride and alcohol groups that may be present on one or more composition components such as a resin component.

Preferred compositions of the invention can undergo hardening upon thermal treatment without the use of any separate crosslinker component, including such previously employed crosslinkers such as amine-based materials (e.g. melamine, glycouril or benzoquanamine) or epoxy materials.

Underlying Coating Compositions

Preferred coating compositions of the invention may suitably comprise one or more resins. The one or more resins may suitably comprise one or more chromophore groups and one or more moieties that can result in hardening of a composition coating layer upon thermal treatment.

Preferred resins may be copolymers with two or more distinct repeat units. Acrylate resins can be particularly suitable for many applications. Higher order resins also are preferred including terpolymer (three distinct repeat units) and tetrapolymers (four distinct repeat units).

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604 from Union Carbide, or the surfactant FC 171 or FC 431 available from the 3M Company.

Acrylate-based resins can be prepared by known methods, such as polymerization (e.g. in the presence of a radical initiator) of one or more acrylate monomers such as e.g. hydroxyethylmethylacrylate, hydroxyethylacrylate, methylmethacrylate, butyl methacrylatemethylanthracene methacrylate or other anthracene acrylate and the like. Other monomers including anhydrides such as maleic anhydride can be co-polymerized with acrylate monomers. For use in antireflective compositions, one or more co-polymerized monomers can contain suitable chromophore groups, such as anthracene for use in antireflective coating compositions utilized with an overcoated photoresist imaged with 248 nm radiation, or phenyl for use in an antireflective coating composition imaged with 193 nm radiation. See also the examples which follow for suitable syntheses of resins useful in coating compositions of the invention.

Particularly preferred coating compositions of the invention comprise one or more components that comprise anhydride and hydroxyl moieties. In such preferred compositions, anhydride and hydroxyl moieties may be present together on a single composition component such as a resin, e.g. by copolymerizing monomers that contain hydroxyl groups with anhydride monomers. Alternatively, anhydride and hydroxyl moieties may be present together on a distinct composition component such as distinct resins, e.g. where one resin comprises anhydride groups and a distinct resin comprises hydroxyl groups.

As discussed above, for antireflective applications, suitably one or more of the compounds reacted to form the resin comprise a moiety that can function as a chromophore to absorb radiation employed to expose an overcoated photoresist coating layer. For example, a phenyl compound such as styrene or a phenyl acrylate (e.g. benzyl acrylate or benzyl methacrylate) may be polymerized with other monomers to provide a resin particularly useful in an antireflective composition employed with a photoresist imaged at sub-200 nm wavelengths such as 193 nm. Similarly, resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$ alkyl naphthalenedicarboxylate. Reactive anthracene compounds also are preferred, e.g. an anthracene compound having one or more carboxy or ester groups, such as one or more methyl ester or ethyl ester groups.

For deep UV applications (i.e. the overcoated resist is imaged with deep UV radiation), a polymer of an antireflective composition preferably will absorb reflections in the deep UV range (typically from about 100 to 300 nm). Thus, the polymer preferably contains units that are deep UV chromophores, i.e. units that absorb deep UV radiation. Highly conjugated moieties are generally suitable chromophores. Aromatic groups, particularly polycyclic hydrocarbon or heterocyclic units, are typically preferred deep UV chromophore, e.g. groups having from two to three to four fused or separate rings with 3 to 8 members in each ring and zero to three N, O or S atoms per ring. Such chromophores include optionally substituted phenanthryl, optionally substituted anthracyl, optionally substituted acridine, optionally substituted naphthyl, optionally substituted quinolinyl and ring-substituted quinolinyls such as hydroxyquinolinyl groups. Optionally substituted anthracenyl groups are particularly preferred for 248 nm imaging of an overcoated resist. Preferred antireflective composition resins have pendant anthracene groups. Preferred resins include those of Formula I as disclosed on page 4 of European Published Application 813114A2 of the Shipley Company.

Another preferred resin binder comprises optionally substituted quinolinyl groups or a quinolinyl derivative that has one or more N, O or S ring atoms such as a hydroxyquinolinyl. The polymer may contain other units such as carboxy and/or alkyl ester units pendant from the polymer backbone. A particularly preferred antireflective composition resin in an acrylic containing such units, such as resins of formula II disclosed on pages 4-5 of European Published Application 813114A2 of the Shipley Company.

As discussed above, for imaging at 193 nm, the antireflective composition preferably may contain a resin that has phenyl chromophore units. For instance, one suitable antireflective resin for use with photoresists imaged at 193 nm is a terpolymer consisting of polymerized units of styrene, maleic anhydride, and 2-hydroxyethyl methacrylate.

Preferably resins of antireflective compositions of the invention will have a weight average molecular weight (Mw) of about 1,000 to about 10,000,000 daltons, more typically about 5,000 to about 1,000,000 daltons, and a number average molecular weight (Mn) of about 500 to about 1,000,000 daltons. Molecular weights (either Mw or Mn) of the polymers of the invention are suitably determined by gel permeation chromatography.

While coating composition resins having absorbing chromophores are generally preferred, antireflective compositions of the invention may comprise other resins either as a co-resin or as the sole resin binder component. For example, phenolics, e.g. poly(vinylphenols) and novolaks, may be employed. Such resins are disclosed in the incorporated European Application EP 542008 of the Shipley Company. Other resins described below as photoresist resin binders also could be employed in resin binder components of antireflective compositions of the invention.

The concentration of such a resin component of the coating compositions of the invention may vary within relatively broad ranges, and in general the resin binder is employed in a concentration of from about 50 to 95 weight percent of the total of the dry components of the coating composition, more typically from about 60 to 90 weight percent of the total dry components (all components except solvent carrier).

Acid or Acid Generator Compound (Optional Component)

Coating compositions of the invention may comprise additional optional components. Thus, for example, a coating composition may suitably comprise an added acid source such as an acid or acid generator compound particularly a thermal acid generator compound whereby the applied coating composition can be hardened such as by thermal treatment prior to application of an overcoated photoresist layer.

However, as discussed above, in preferred aspects, coating compositions of the invention may be formulated without such an added acid or acid generator compound(s). Such compositions free or at least essentially free of any added acid or acid generator compounds may provide performance benefits, including enhanced shelf life. As referred to herein a composition that is essentially free of added acid or acid generator compounds has less than 3, 2 or 1 weight percent of added acid or acid generator compounds based on total weight of the formulated solvent-based coating composition. As also referred to herein, an added acid is distinct from residual acid that may be present in a composition, such as residual acid entrapped in a resin remaining from the resin synthesis.

If an added acid or acid generator compound are employed, a coating composition suitably comprises a thermal acid generator compound (i.e. compound that generates acid upon thermal treatment), such as an ionic or substantially neutral thermal acid generator, e.g. an ammonium arenesulfonate salt, for catalyzing or promoting crosslinking during curing of an antireflective composition coating layer. Typically one or more thermal acid generators are present in an antireflective composition in a concentration from about 0.1 to 10 percent by weight of the total of the dry components of the composition (all components except solvent carrier), more preferably about 2 percent by weight of the total dry components.

Coating compositions of the invention also may contain one or more photoacid generator compounds typically in addition to another acid source such as an acid or thermal acid generator compound. In such use of a photoacid generator compound (PAG), the photoacid generator is not used as an acid source for promoting a crosslinking reaction, and thus preferably the photoacid generator is not substantially activated during crosslinking of the coating composition (in the case of a crosslinking coating composition). Such use of photoacid generators is disclosed in U.S. Pat. No. 6,261,743 assigned to the Shipley Company. In particular, with respect to coating compositions that are thermally crosslinked, the coating composition PAG should be substantially stable to the conditions of the crosslinking reaction so that the PAG can be activated and generate acid during subsequent exposure of an overcoated resist layer. Specifically, preferred PAGs do not substantially decompose or otherwise degrade upon exposure of temperatures of from about 140 or 150 to 190° C. for 5 to 30 or more minutes.

Generally preferred photoacid generators for such use in antireflective compositions or other coating of the invention include e.g. onium salts such as di(4-tert-butylphenyl)iodonium perfluoroctane sulphonate, halogenated non-ionic photoacid generators such as 1,1-bis[p-chlorophenyl]-2,2,2-trichloroethane, and other photoacid generators disclosed for use in photoresist compositions. For at least some antireflective compositions of the invention, antireflective composition photoacid generators will be preferred that can act as surfactants and congregate near the upper portion of the antireflective composition layer proximate to the antireflective composition/resist coating layers interface. Thus, for example, such preferred PAGs may include extended aliphatic groups, e.g. substituted or unsubstituted alkyl or alicyclic groups having 4 or more carbons, preferably 6 to 15 or more carbons, or fluorinated groups such as $C_{1-15}$alkyl or $C_{2-15}$alkyl alkenyl having one or preferably two or more fluoro substituents.

Formulation of an Underlying Coating Composition

To make a liquid coating composition of the invention, the components of the underlying coating composition are dissolved in a suitable solvent such as, for example, one or more oxyisobutyric acid esters particularly methyl-2-hydroxyisobutyrate as discussed above, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. A preferred solvent for an antireflective coating composition of the invention is methyl-2-hydroxyisobutyrate, optionally blended with anisole. The concentration of the dry components in the solvent will depend on several factors such as the method of application. In general, the solids content of an antireflective composition varies from about 0.5 to 20 weight percent of the total weight of the coating composition, preferably the solids content varies from about 2 to 10 weight of the coating composition.

Exemplary Photoresist Systems

A variety of photoresist compositions can be employed with coating compositions of the invention, including positive-acting and negative-acting photoacid-generating compositions. Photoresists used with underlying compositions of the invention typically comprise a resin binder and a photoactive component, typically a photoacid generator compound. Preferably the photoresist resin binder has functional groups that impart alkaline aqueous developability to the imaged resist composition.

Particularly preferred photoresists for use with underlying compositions of the invention are chemically-amplified resists, particularly positive-acting chemically-amplified resist compositions, where the photoactivated acid in the resist layer induces a deprotection-type reaction of one or more composition components to thereby provide solubility differentials between exposed and unexposed regions of the resist coating layer. A number of chemically-amplified resist compositions have been described, e.g., in U.S. Pat. Nos. 4,968,581; 4,883,740; 4,810,613; 4,491,628 and 5,492,793, al of which are incorporated herein by reference for their teaching of making and using chemically amplified positive-acting resists. Coating compositions of the invention are particularly suitably used with positive chemically-amplified photoresists that have acetal groups that undergo deblocking in the presence of a photoacid. Such acetal-based resists have been described in e.g. U.S. Pat. Nos. 5,929,176 and 6,090,526.

The underlying compositions of the invention also may be used with other positive resists, including those that contain resin binders that comprise polar functional groups such as hydroxyl or carboxylate and the resin binder is used in a resist composition in an amount sufficient to render the resist developable with an aqueous alkaline solution. Generally preferred resist resin binders are phenolic resins including phenol aldehyde condensates known in the art as novolak resins, homo and copolymers or alkenyl phenols and homo and copolymers of N-hydroxyphenyl-maleimides.

Preferred positive-acting photoresists for use with an underlying coating composition of the invention contains an imaging-effective amount of photoacid generator compounds and one or more resins that are selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042, 997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526.

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057, 083; European Published Applications EP01008913A1 and EP00930542A1; and U.S. pending patent application Ser. No. 09/143,462, and iii) polymers that contain polymerized anhydride units, particularly polymerized maleic anhydride and/or itaconic anhydride units, such as disclosed in European Published Application EP01008913A1 and U.S. Pat. No. 6,048,662.

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914.

4) a resin that contains fluorine substitution (fluoropolymer), e.g. as may be provided by polymerization of tetrafluoroethylene, a fluorinated aromatic group such as fluorostyrene compound, and the like. Examples of such resins are disclosed e.g. in PCUUS99/21912.

Suitable photoacid generators to employ in a positive or negative acting photoresist overcoated over a coating composition of the invention include imidosulfonates such as compounds of the following formula:

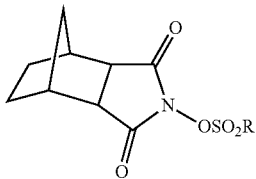

wherein R is camphor, adamantane, alkyl (e.g. $C_{1-12}$ alkyl) and perfluoroalkyl such as perfluoro (e.g. $C_{1-12}$ alkyl) particularly perfluorooctanesulfonate, perfluorononanesulfonate and the like. A specifically preferred PAG is N-[(perfluorooctanesulfonyl)oxy]-5-norbornene-2,3 dicarboximide.

Sulfonate compounds are also suitable PAGs for resists overcoated a coating composition of the invention, particularly sulfonate salts. Two suitable agents for 193 nm and 248 nm imaging are the following PAGS 1 and 2:

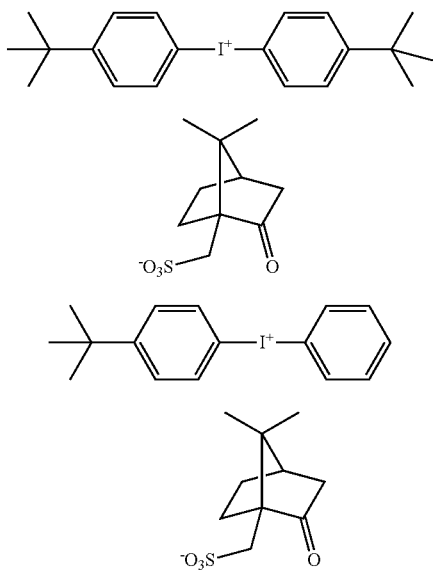

Such sulfonate compounds can be prepared as disclosed in European Patent Application 96118111.2 (publication number 0783136), which details the synthesis of above PAG 1. Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro (e.g. $C_{1-12}$ alkyl) particularly perfluorooctanesulfonate, perfluorobutanesulfonate and the like.

Other known PAGS also may be employed in photoresist used with underlying coating compositions.

A preferred optional additive of photoresists overcoated a coating composition of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Preferred negative-acting resist compositions for use with an overcoated coating composition of the invention comprise a mixture of materials that will cure, crosslink or harden upon exposure to acid, and a photoacid generator.

Particularly preferred negative-acting resist compositions comprise a resin binder such as a phenolic resin, a crosslinker component and a photoactive component of the invention. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-fobrmaldehyde resins are generally most preferred. Such crosslinkers are commercially available, e.g. the melamine resins sold by Cytec Industries under the trade names Cymel 300, 301 and 303. Glycoluril resins are sold by Cytec Industries under trade names Cymel 1170, 1171, 1172, Powderlink 1174, and benzoguanamine resins are sold under the trade names of Cymel 1123 and 1125.

Suitable photoacid generator compounds of resists used with underlying compositions of the invention include the onium salts, such as those disclosed in U.S. Pat. Nos. 4,442,197, 4,603,10, and 4,624,912, each incorporated herein by reference; and non-ionic organic photoactive compounds such as the halogenated photoactive compounds as in U.S. Pat. No. 5,128,232 to Thackeray et al. and sulfonate photoacid generators including sulfonated esters and sulfonlyoxy ketones. See J. of Photopolymer Science and Technology, 4(3):337-340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al. The above camphorsulfoanate PAGs 1 and 2 are also preferred photoacid generators for resist compositions used with the underlying compositions of the invention, particularly chemically-amplified resists of the invention.

Photoresists for use with an antireflective composition of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from about 5 to 50 percent by weight of the total weight of a resist's dry components.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 m, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the antireflective composition. Cure conditions will vary with the components of the coating composition. Typical cure conditions are from about 150° C. to 250° C. for about 0.5 to 5 minutes. Cure conditions preferably render the coating composition coating layer substantially insoluble to the photoresist solvent as well as an alkaline aqueous developer solution.

After such curing, a photoresist is applied above the surface of the top coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation through a mask in a conventional manner. The exposure energy is sufficient to effectively activate the photoactive component of the resist system to produce a patterned image in the resist coating layer. Typically, the exposure energy ranges from about 3 to 300 mJ/cm$^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g. water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed resist coating layer is then developed, preferably with an aqueous based developer such as an alkali exemplified by tetramethyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100° C. to about 150° C. for several minutes to further cure the developed exposed coating layer areas.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch.

The following non-limiting examples are illustrative of the invention.

EXAMPLES 1-10—RESIN SYNTHESES

General Procedures for Anhydride-Polymer Synthesis as Employed in Examples 1-10

The reaction set up consisted of a three-neck, round-bottom flask of appropriate size containing a magnetic stir bar, and fitted with a temperature probe, dropping funnel, water-cooled condenser, dispense line attached to a syringe fitted to a syringe pump, and a nitrogen inlet (blanket). The temperature was controlled using an oil bath in tandem with a hotplate/stirplate. Initially charged to the flask was a monomer and solvent. To the dropping funnel was added the initiator solution. A feed solution containing monomers and solvent was placed in the syringe and affixed to the syringe pump. The mixture in the flask was heated to approximately 70° C. before adding the initiator solution. The monomer solution in the syringe was then delivered to the reaction mixture at a continuous rate over a period of 3-3.5 hours. When the addition was complete, the reaction mixture was allowed to continue stirring at 70° C. for an additional 30 minutes. The reaction was then thermally quenched by removing the heat source, diluting with solvent, and allowing the mixture to cool to room temperature.

GPC was determined relative to polystyrene standards with RI detection (495 dalton cutoff) and THF as elution solvent. Some polymers in the examples below were further characterized for either optical density (OD). The polymers were spin-coated from solution onto both silicon and quartz wafers. The thickness of the films on silicon was measured. The absorptivity of the films on quartz was determined by UV spectrophotometry. The absorptivity was measured against a blank quartz wafer. From the thickness and absorptivity measurements, the OD was calculated at 13 nm.

Monomers:
3,4-Dihydro-2H-pyran (DHP)
Maleic Anhydride (MA)
2-Hydroxyethyl Methacrylate (HEMA)
t-Butyl Methacrylate (tBMA)
3,5-Bis(hexafluoro-2-hydroxy-2-propyl)cyclohexyl Methacrylate (HFACHM)
Pentafluoroethyl Acrylate (PFA)
Methyl Methacrylate (MMA)
Styrene
Benzyl Methacrylate (BMA)
Initiators:
V-601
Vazo-67
Solvents:
Tetrahydrofuran (THF)
Isopropanol (IPA)
Methyl, 2-Hydroxyisobutyrate (HBM)

In the following Examples 1-10, the above anhydride resin synthesis procedure was employed with reagents as specified in the particular example. The above-listed reagents were employed as designated with the specified abbreviations. The molar ratios of the repeat units of the produced resin is specified in the Example hearing, thus in Example, the produced resin 35/35/30 DHP/MA/HEMA had 35 mole percent of polymerized 3,4-dihydro-2H-pyran, 35 mole percent maleic anhydride and 30 mole percent 2-hydroxyethyl methacrylate.

EXAMPLE 1—35/35/30 DHP/MA/HEMA

Initial contents to reaction flask: DHP 16.2 g (193 mmol), and THF 31.7 g
To dropping funnel: V-601 2.53 g, and THF 3.71 g
Added from syringe: MA 18.9 g (193 mmol), HEMA 21.5 g (165 mmol), and THE 22 g Diluent: THF 66 g
Following the reaction, the solution was precipitated into IPA, washed with IPA, filtered, air-dried, and then dried in vacuo at 40 C overnight to yield 38 g (67%) of a dry powder.
Mw=18,817, Mn=5347

EXAMPLE 2—45/50/5 MA/HEMA/TBMA

Initial contents to reaction flask: MA 23.7 g (242 mmol), and HBM 44 g
To dropping funnel: Vazo-67 2.6 g, and HBM 4.8 g
Added from syringe: HEMA 34.9 g (268 mmol), tBMA 3.81 g (26.8 mmol), and HBM 46 g Diluent: HBM 490 g
Mw=27,711, Mn=5567

EXAMPLE 3—45/50/5 MA/HEMA/TBMA

Initial contents to the reaction flask: MA 23.7 g (242 mmol), and HIM 132 g
To dropping funnel: Vazo-67 2.6 g, and HBM 14.5 g
Added from syringe: HEMA 34.9 g (268 mmol), tBMA 3.81 (26.8 mmol), and HBM 48.5 g Diluent: HBM 390 g
Mw=19,822, Mn=7992

EXAMPLE 4—50/50 MA/HFACHM

Initial contents to the reaction flask: MA 4.1 g (42 mmol), and HBM 23 g
To dropping funnel: Vazo-67 1.0 g, and HBM 6 g
Added from syringe: HFACHM 20.9 g (42 mmol), and HBM 49 g Diluent: HBM 156 g
Mw=36,741, Mn=12,469

EXAMPLE 5—50/30/20 MA/PFA/HEMA

Initial contents to reaction flask: MA 11.2 g (114 mmol), and HBM 62.5 g
To dropping funnel: Vazo-67 1.3 g, and HBM 7.3 g
Added from syringe: PFA 14.0 g (69 mmol), HEMA 6.0 g (46 mmol), and HBM 27.7 g Diluent: HBM 182 g
Mw=23,877, Mn=8322

EXAMPLE 6—45/30/25 MA/MMA/HEMA

Initial contents to reaction flask: MA 25.6 g (261 mmol), and HBM 144 g
To dropping funnel: Vazo-67 2.6 g, and HBM 14.5 g
Added from syringe: HEMA 19.0 g (146 mmol), MMA 17.6 g (176 mmol), and HBM 36.5 g Diluent: HBM 390 g
Mw=33,843, Mn=13,973

EXAMPLE 7—45/45/10 MA/MMA/HEMA

Initial contents to reaction flask: MA 26.95 g (275 mmol), and HBM (150 g)
To the dropping funnel: Vazo-67 2.6 g, and HBM 14.5 g
Added from syringe: HEMA 7.95 g (61 mmol), MMA 27.5 g (275 mmol), and HBM 30.5 g Diluent: HBM 390 g
Mw=33,588, Mn=13,893

EXAMPLE 8—20/35/45 Styrene/HEMA/MA

Initial contents to reaction flask: MA 24.9 g (254 mmol), and HBM 141 g
To the dropping funnel: Vazo-67 2.6 g, and HBM 15 g
Added from syringe: HEMA 25.7 g (198 mmol), styrene 11.8 g (113 mmol), and HBM 39 g Diluent: HBM 390 g
Mw=46,623, Mn=14,479, OD=8.51 (193 nm)

EXAMPLE 9—10/45/45 Styrene/HEMA/MA

Initial contents to reaction flask: MA 24.3 g (248 mmol), and HBM 138.5 g
To the dropping funnel: Vazo-67 2.6 g, and HBM 14.5 g
Added from syringe: HEMA 32.3 g (248 mmol), styrene 5.7 g (55 mmol), and HBM 42 g Diluent: HBM 390 g
Mw=34,778, Mn=12,993, OD=4.96 (193 nm)

EXAMPLE 10—45/30/25 MA/HEMA/BMA

Initial contents to reaction flask: MA 21.5 g (219 mmol), and HBM 125 g
To dropping funnel: Vazo-67 3 g, and HBM 15 g
Added from syringe: HEMA 19.0 g (146 mmol), BMA 21.5 g (122 mmol), and HBM 58 g Diluent: HBM 390 g EXAMPLES 11-22 (Polymer Solutions)

The examples in the below Tables 1 and 2 contain only polymer and HBM solvent. No other additives were used. Examples 11-15 contain only one polymer as indicated in Table 1. For Examples 16-22, three unique polymers are blended at the amounts indicated in Table 2, and are as follows:
MA polymer=45/45/10 MA/MMA/HEMA (Mw=33,588)
Polyester=Poly(1,4-dimethyl terephthalate-co-1,3,5-tris(2-hydroxyethyl)cyanuric acid (Mw-3000)
Acrylate=40/60 HEMA/MMA (Mw=11,257)
General Procedures for Coating Wafers
For all wafers (silicon or quartz) spin-coated with the formulated samples, the spin time was 30 s, at 2000 rpm. Then the wafers were baked on a hotplate for 60 s at the temperature indicated in the tables below. The thickness of the films on silicon wafers was measured by ellipsometry (nanospeck).
General Procedures for Measuring Solvent Resistance
Each sample solution tested for solvent resistance was spin-coated onto a silicon wafer. The thickness of the wafer was measured using ellipsometry (nanospeck). HBM poured over the surface of the wafer and allowed to sit for 60 seconds. The wafer was then spun dry at 4000 rpm for 60 seconds and the thickness was measured again.

TABLE 1

Change in Film Thickness Following Thermal Cure and Solvent Strip

| Example | Polymer | Mw | 90° C. | 115° C. | 150° C. | 180° C. | 215° C. |
|---|---|---|---|---|---|---|---|
| 11 | 45/50/5 MA/HEMA/tBMA | 27,711 | −7.4% | −0.1% | 1.2% | 0% | −0.1% |
| 12 | 45/50/5 MA/HEMA/tBMA | 19,822 | — | — | −1.9% | 0% | 0.3% |
| 13 | 35/35/30 DHP/MA/HEMA | 23,151 | — | — | — | — | 0% |
| 14 | 20/35/45 Styrene/HEMA/MA | 46,623 | — | — | — | — | 0.2% |
| 15 | 10/45/45 Styrene/HEMA/MA | 37,778 | — | — | — | — | −0.3% |

TABLE 2

Film Thickness Remaining After Thermal Cure and Solvent Strip

| Example | MA Polymer | Polyester | Acrylate | 120° C. | 150° C. | 180° C. | 210° C. | 240° C. |
|---|---|---|---|---|---|---|---|---|
| 16 | 25 | 75 | — | 0.4% | 0% | 3.2% | 1.6% | 2.1% |
| 17 | 50 | 50 | — | 2.7% | 3.0% | 0.8% | 78.9% | 97.6% |
| 18 | 75 | 25 | — | 0.1% | 4.9% | 12.7% | 86.4% | 96.4% |
| 19 | 25 | — | 75 | 1.5% | 3.3% | 28.6% | 40.1% | 48.2% |
| 20 | 50 | — | 50 | 4.1% | 8.4% | 50.7% | 67.7% | 77.8% |
| 21 | 75 | — | 25 | 35.6% | 71.8% | 87.4% | 91.1% | 94.0% |
| 22 | 100 | — | — | 68.9% | 88.2% | 95.0% | 94.6% | 95.2% |

EXAMPLES 22-25 (Additional Coating Composition Processing)

Examples 22-25 in Table 3 below demonstrate polymer insolubility to a typical resist solvent and to a developer after a thermal treatment. Poly(styrene-co-maleic anhydride), cumene terminated with a typical Mn of about 1,600 and poly(styrene-co-allyl alcohol) with a typical Mn of about 1,200 (both purchased from Aldrich Chemical Company) were co-dissolved in propylene glycol monomethylether acetate to form several 10 weight percent solutions containing different amounts of each polymer. The solutions were filtered through a 0.2 μm filter and each spin coated on a set of two six inch wafers using a DNS track at 3000 rpm. The coated wafers were then heated for 60 seconds to the indicated temperature using a hot plate to induce cross-linking. One of the wafer of each set was covered with a puddle of ethyl lactate, EL, for 60 seconds and then spun dry. The second wafer was immersed in a bath of 0.26N tetramentylammonium hydroxide, TMAH, solution for 60 seconds followed by a water rinse and a nitrogen blow dry. Film thickness (FT) was measured after the bake and after the solvent or developer exposure using a Thermowave instrument.

TABLE 3

| Examples | % Styrene-co-allyl alcohol | Bake □ C. | Initial FT Å | EL, 60 sec. | TMAH, 60 sec | % Loss to EL | % Loss to TMAH |
|---|---|---|---|---|---|---|---|
| Example 22 | 50 | 200 | 2117 | 2097 | | 1 | |
| | | 200 | 2126 | | 2129 | | −0.13 |
| Example 23 | 25 | 200 | 2132 | 2127 | | 0.22 | |
| | | 200 | 2135 | | 2139 | | −0.2 |
| Example 24 | | 200 | 2182 | 2178 | | 0.2 | |
| | 20 DPH-MA-HEMA | 200 | 2179 | | 2181 | | −0.1 |
| Example 25 | | 225 | 8278 | 8236 | | 0.5 | |
| | 100% | 225 | 8365 | | 8453 | | −1.05 |

EXAMPLE 26—LITHOGRAPHIC PROCESSING

This example shows use of an underlying coating composition of the invention as an underlayer/anti reflective layer to a 193 nm resist.

Process Conditions

1) Underlayer: 215 nm coating layer of Example 26 cured at 200° C./60 seconds on a vacuum hotplate;

2) Photoresist: 260 nm coating layer of an acrylate-based 193 nm photoresist soft-baked at 120° C./60 seconds on a vacuum hotplate;

3) Exposure: the applied photoresist layer was exposed to patterned 193 nm radiation;

4) Post-Exposure Bake: 120° C./60 seconds;

5) Development: the latent image was developed with 0.26N aqueous alkaline developer to provide a photoresist relief image.

What is claimed is:

1. A coated substrate comprising:
   an organic coating composition layer comprising 1) a first resin that comprises anhydride group and 2) a second resin that is distinct from the first resin and comprises hydroxyl groups,
   wherein the first and second resins are acrylate resins;
   a photoresist composition layer above the organic coating composition layer.

2. A substrate of claim 1 wherein the organic coating composition is free of an amine-containing crosslinker component and an epoxy crosslinker component.

3. A substrate of claim 1 wherein the organic coating composition is free of an amine-containing crosslinker component.

4. A substrate of claim 1 wherein the organic coating composition is free of an epoxy crosslinker component.

5. A substrate of claim 1 wherein the first resin or second resin comprises one or more phenyl groups.

6. A substrate of claim 1 wherein the organic coating composition layer is at least essentially free of an acid or acid generator compound.

7. A substrate of claim 1 wherein the photoresist composition layer comprises one or more resin with photoacid-labile groups and is substantially free of aromatic groups.

8. A substrate of claim 1 wherein the organic coating composition is an antireflective coating composition.

9. An antireflective composition for use with an overcoated photoresist layer, the antireflective coating composition comprising 1) a first resin that comprises anhydride group and 2) a second resin that is distinct from the first resin and comprises hydroxyl groups,
   wherein the first and second resins are acrylate.

10. An antireflective coating composition of claim 9 wherein the antireflective composition is free of an amine-containing crosslinker component and an epoxy crosslinker component.

11. An antireflective coating composition of claim 9 wherein the antireflective composition is free of an amine-containing crosslinker component.

12. An antireflective composition of claim 9 wherein the antireflective composition is free of an epoxy crosslinker component.

13. An antireflective composition of claim 9 wherein the first resin or second resin comprises one or more phenyl groups.

14. An antireflective composition of claim 9 wherein the antireflective composition is at least essentially free of an acid or acid generator compound.

15. A coating composition, comprising 1) a first resin that comprises anhydride group and 2) a second resin that is distinct from the first resin and comprises hydroxyl groups, wherein the first and second resins are acrylate resins.

* * * * *